(12) United States Patent
Koide et al.

(10) Patent No.: US 11,862,484 B2
(45) Date of Patent: Jan. 2, 2024

(54) SEMICONDUCTOR MANUFACTURING APPARATUS AND MANUFACTURING METHOD OF SEMICONDUCTOR DEVICE

(71) Applicant: KIOXIA CORPORATION, Minato-Ku (JP)

(72) Inventors: Tatsuhiko Koide, Kuwana (JP); Yoshihiro Ogawa, Yokkaichi (JP); Masahiro Kiyotoshi, Yokkaichi (JP)

(73) Assignee: KIOXIA CORPORATION, Minato-ku (JP)

( * ) Notice: Subject to any disclaimer, the term of this patent is extended or adjusted under 35 U.S.C. 154(b) by 65 days.

(21) Appl. No.: 16/837,574

(22) Filed: Apr. 1, 2020

(65) Prior Publication Data

US 2020/0251356 A1     Aug. 6, 2020

Related U.S. Application Data (62) Division of application No. 13/953,002, filed on Jul. 29, 2013, now abandoned.

(30) Foreign Application Priority Data

Jan. 25, 2013   (JP) ................................ 2013-011850

(51) Int. Cl.
     *H01L 21/67*      (2006.01)
     *H01L 21/02*      (2006.01)
     *H01L 21/308*      (2006.01)
     *H10B 41/30*      (2023.01)

(52) U.S. Cl.
CPC .... *H01L 21/67034* (2013.01); *H01L 21/0206* (2013.01); *H01L 21/02057* (2013.01); *H01L 21/02068* (2013.01); *H01L 21/3086* (2013.01); *H10B 41/30* (2023.02)

(58) Field of Classification Search
None
See application file for complete search history.

(56) References Cited

U.S. PATENT DOCUMENTS

| | | | |
|---|---|---|---|
| 7,749,909 B2 | 7/2010 | Tomita et al. | |
| 7,838,425 B2 | 11/2010 | Tomita et al. | |
| 7,958,898 B2 | 6/2011 | Yoshida | |

(Continued)

FOREIGN PATENT DOCUMENTS

| | | | | |
|---|---|---|---|---|
| JP | 2000-195821 A | | 7/2000 | |
| JP | 2008198741 A | * | 8/2008 | ....... H01L 21/02057 |

(Continued)

OTHER PUBLICATIONS

Machine Generated English Translation of JP 2009-218456 published Sep. 24, 2009.

(Continued)

*Primary Examiner* — Sylvia MacArthur
(74) *Attorney, Agent, or Firm* — Oblon, McClelland, Maier & Neustadt, L.L.P.

(57) ABSTRACT

A semiconductor manufacturing apparatus according to the present embodiment comprises a chamber. A chemical-agent supply part is configured to supply a water-repellent agent or an organic solvent to a surface of a semiconductor substrate having been cleaned with a cleaning liquid in the chamber. A spray part is configured to spray a water-capture agent capturing water into an atmosphere in the chamber.

8 Claims, 7 Drawing Sheets

(56) References Cited

U.S. PATENT DOCUMENTS

| | | | |
|---|---|---|---|
| 7,985,683 B2 | 7/2011 | Tomita et al. | |
| 7,998,308 B2* | 8/2011 | Kaneko | H01L 21/67051 134/119 |
| 8,043,469 B2 | 10/2011 | Nakamori | |
| 8,051,862 B2* | 11/2011 | Ito | H01L 21/67051 134/94.1 |
| 8,337,659 B2* | 12/2012 | Orii | H01L 21/67034 156/345.55 |
| 8,394,228 B2* | 3/2013 | Christenson | G03F 7/423 156/345.55 |
| 8,828,183 B2 | 9/2014 | Namba | |
| 9,202,724 B2* | 12/2015 | Hayashi | H01L 21/67051 |
| 9,245,737 B2* | 1/2016 | Aiura | H01L 21/6708 |
| 9,252,009 B2* | 2/2016 | Mizuno | H01L 21/68792 |
| 9,732,416 B1* | 8/2017 | Stephens | C23C 16/4584 |
| 9,773,687 B2* | 9/2017 | Wakiyama | H01L 21/6719 |
| 9,984,903 B2* | 5/2018 | Higuchi | H01L 21/67051 |
| 2004/0053147 A1 | 3/2004 | Ito | |
| 2007/0289528 A1* | 12/2007 | Nanba | H01L 21/67051 118/52 |
| 2008/0022928 A1* | 1/2008 | Sanada | H01L 21/67017 118/52 |
| 2008/0023444 A1 | 1/2008 | Osawa | |
| 2008/0190454 A1* | 8/2008 | Eitoku | H01L 21/67028 134/30 |
| 2009/0141748 A1 | 6/2009 | Koyama et al. | |
| 2009/0311874 A1 | 12/2009 | Tomita et al. | |
| 2010/0075504 A1 | 3/2010 | Tomita et al. | |
| 2010/0144158 A1* | 6/2010 | Ito | H01L 21/67051 438/758 |
| 2010/0240219 A1 | 9/2010 | Tomita et al. | |
| 2010/0269865 A1 | 10/2010 | Sekiguchi | |
| 2011/0139192 A1* | 6/2011 | Koide | H01L 21/67028 134/94.1 |
| 2011/0143545 A1 | 6/2011 | Okuchi et al. | |
| 2012/0045581 A1 | 2/2012 | Kimura et al. | |
| 2012/0164339 A1* | 6/2012 | Nakamori | H01L 21/67051 118/612 |
| 2012/0234356 A1* | 9/2012 | Nishi | H01L 21/02052 134/21 |
| 2012/0273011 A1* | 11/2012 | Osada | H01L 21/02082 134/33 |
| 2014/0213064 A1 | 7/2014 | Koide et al. | |
| 2020/0251356 A1* | 8/2020 | Koide | H01L 21/67034 |

FOREIGN PATENT DOCUMENTS

| | | | |
|---|---|---|---|
| JP | 2009-140992 | | 6/2009 |
| JP | 2009-218456 A | | 9/2009 |
| JP | 2010-7168 | | 1/2010 |
| JP | 2010024484 A | * | 2/2010 |
| JP | 2010-114414 | | 5/2010 |
| JP | 2010-258068 A | | 11/2010 |
| JP | 2011-129583 A | | 6/2011 |
| JP | 2011-129585 | | 6/2011 |
| JP | 2012-138482 A | | 7/2012 |
| JP | 2012-209299 | | 10/2012 |
| JP | 2012-212758 | | 11/2012 |
| JP | 2012-222329 | | 11/2012 |
| TW | 201104740 A1 | | 2/2011 |
| WO | WO-9929439 A1 | * | 6/1999 ............. B05C 11/08 |

OTHER PUBLICATIONS

Machine Generated English Translation of JP 2012-222329 published Nov. 11, 2012.

Office Action dated Aug. 18, 2016 in Chinese Application No. 201310503545.X, along with an English translation.

Office Action dated Mar. 15, 2016 in Japanese Patent Application No. 2013-011850 (with English language translation).

Combined Chinese Office Action and Search Report dated Mar. 3, 2016 in Patent Application No. 201310503545.X (with English language translation and English language translation of categories of cited documents).

Office Action dated Dec. 17, 2015 in Taiwanese Patent Application No. 102137378 (with English language translation).

Office Action dated Sep. 30, 2016 in Japanese Patent Application No. 2013-011850, along with an English translation.

* cited by examiner

SEMICONDUCTOR MANUFACTURING APPARATUS AND MANUFACTURING METHOD OF SEMICONDUCTOR DEVICE

CROSS REFERENCE TO RELATED APPLICATIONS

This application is a division of U.S. application Ser. No. 13/953,002, filed Jul. 29, 2013, which is based upon and claims the benefit of priority from the prior Japanese Patent Application No. 2013-011850, filed on Jan. 25, 2013, the entire contents of which are incorporated herein by reference.

FIELD

The embodiments of the present invention relate to a semiconductor manufacturing apparatus and a manufacturing method of a semiconductor device.

BACKGROUND

Semiconductor device manufacturing processes include various processes such as a lithographic process, an etching process, and an ion implantation process. After the end of each process and before shifting to the next process, a cleaning process and a drying process are performed so as to remove impurities and residues remaining on the surface of a semiconductor substrate to clean the surface of the semiconductor substrate.

In recent years, following the downscaling of elements, the aspect ratio of patterns on a semiconductor substrate has become higher. At a higher aspect ratio, there occurs a problem that capillary (surface tension) causes collapsing of the patterns on the semiconductor substrate in the drying process.

To deal with such a problem, generally, there has been proposed to use Isopropyl alcohol (IPA), which is an organic solvent in the wet cleaning process. In a case of using the IPA, the IPA displaces DIW (deionized water) on a semiconductor substrate W and the surface of the semiconductor substrate is dried with the IPA (subjected to an IPA drying treatment). However, when much water is contained in the atmosphere in a chamber, there is a probability that the IPA absorbs the water at a time of the IPA drying treatment and that watermarks are formed on the surface of the semiconductor substrate when the surface is dried.

Furthermore, there has been proposed a technique for making the surface of the semiconductor substrate water repellent and lowering the capillary that acts between the patterns and a chemical liquid or DIW. However, a water-repellent agent used for making the surface of the semiconductor substrate water repellent is often deactivated after reacting to the water. For example, it often occurs in a cleaning device that the water-repellent agent is deactivated after reacting to the water in a chamber. If such deactivation of the water-repellent agent occurs, the water-repellent agent is unable to make the surface of the semiconductor substrate water repellent and to suppress collapsing of the patterns on the semiconductor substrate resulting from the capillary (surface tension).

DETAILED DESCRIPTION

Embodiments will now be explained with reference to the accompanying drawings. The present invention is not limited to the embodiments.

A semiconductor manufacturing apparatus according to the present embodiment comprises a chamber. A chemical-agent supply part is configured to supply a water-repellent agent or an organic solvent to a surface of a semiconductor substrate having been cleaned with a cleaning liquid in the chamber. A spray part is configured to spray a water-capture agent capturing water into an atmosphere in the chamber.

First Embodiment

Figure 1:
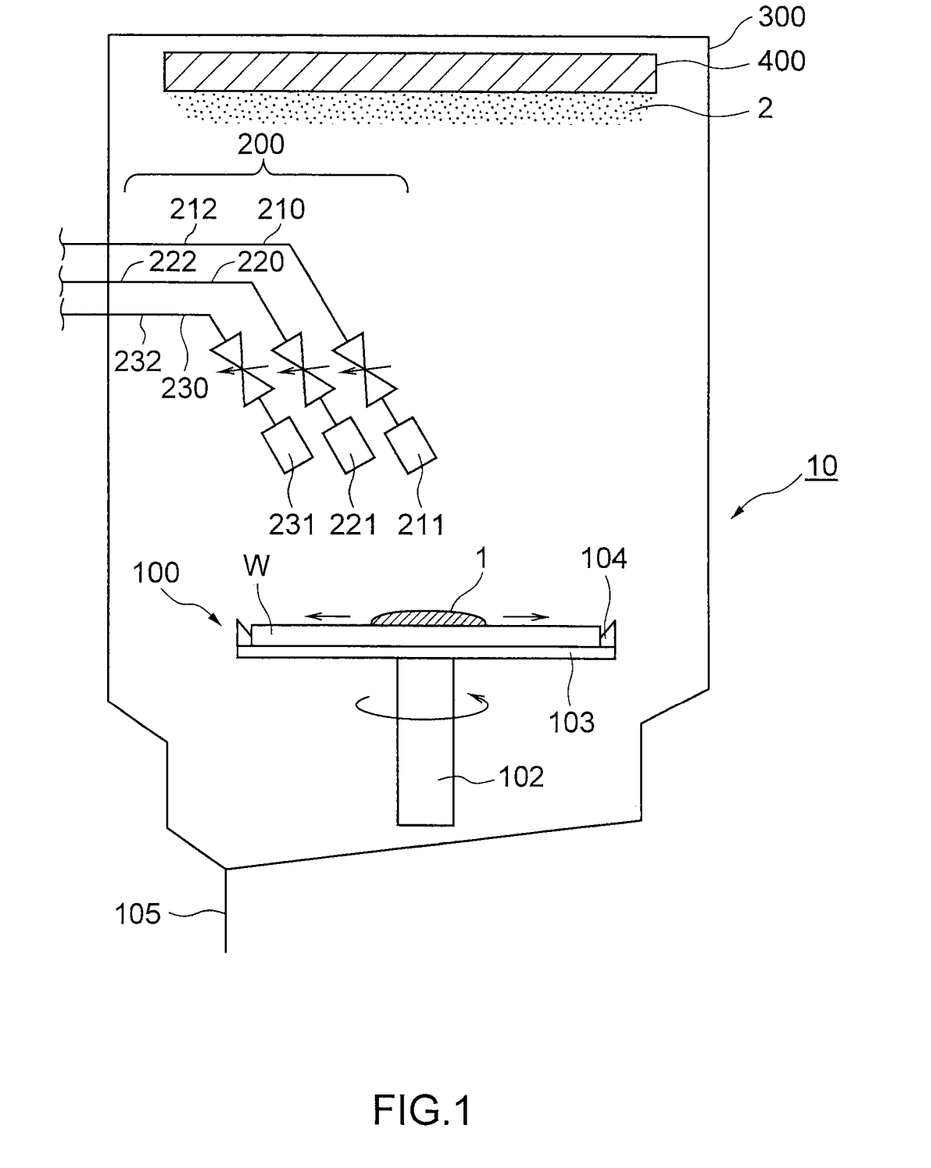
FIG. 1 shows an example of a configuration of a surface treatment apparatus 10 for a semiconductor substrate according to a first embodiment.

FIG. 1 shows an example of a configuration of a surface treatment apparatus 10 for a semiconductor substrate according to a first embodiment. The surface treatment apparatus 10 includes a mounting unit 100 on which a semiconductor substrate (a wafer) W is mounted, a liquid supply unit 200 that supplies liquids, a chamber 300 that hermetically seals the semiconductor substrate W, and a spray unit 400 that sprays a water-capture agent 2.

The mounting unit 100 includes a rotary shaft 102, a spin base 103, and chuck pins 104. The rotary shaft 102 extends substantially in a vertical direction and the disk-like spin base 103 is attached on an upper end of the rotary shaft 102. A motor (not shown) can rotate the rotary shaft 102 and the spin base 103.

The chuck pins 104 are provided on peripheral edges of the spin base 103, respectively. The chuck pins 104 fix the semiconductor substrate W on the spin base 103 by putting the semiconductor substrate W between the chuck pins 104. The mounting unit 100 can rotate the semiconductor substrate W while keeping the semiconductor substrate W substantially horizontally.

The liquid supply unit 200 discharges a liquid 1 to a surface of the semiconductor substrate W near a rotation center thereof. By allowing the mounting unit 100 to rotate the semiconductor substrate W, the discharged liquid 1 can spread in a radial direction of the semiconductor substrate W and can be applied on the surface of the semiconductor substrate W. Furthermore, by allowing the mounting unit 100 to rotate the semiconductor substrate W, the liquid 1 on the semiconductor substrate W can be drained off and the semiconductor substrate W can be spin-dried. The excessive liquid 1 spattering in the radial direction of the semiconductor substrate W is discharged via a waste liquid pipe 105. For example, the liquid 1 is a cleaning liquid, a water-repellent agent, DIW (deionized water) or an organic solvent.

The liquid supply unit 200 includes a first chemical-liquid supply unit 210 that supplies the cleaning liquid for cleaning the semiconductor substrate W to the surface of the semiconductor substrate W, a second chemical-liquid supply unit 220 serving as a chemical-agent supply unit that supplies the water-repellent agent for forming a water-repellent protection film to the surface of the semiconductor substrate W, and a DIW supply unit 230 that supplies the DIW to the surface of the semiconductor substrate W.

The cleaning liquid supplied from the first chemical-liquid supply unit 210 passes through a supply pipe 212 and is discharged from a nozzle 211. For example, the cleaning liquid is an SC1 liquid (Ammonia-Hydrogen Peroxide mixture) or an SPM liquid (Sulfuric acid-Hydrogen Peroxide Mixture) and is a chemical liquid used for removing etching residues and the like.

The water-repellent agent supplied from the second chemical-liquid supply unit 220 passes through a supply pipe 222 and is discharged from a nozzle 221. The water-repellent agent is a chemical liquid for forming the water-repellent protection film on surfaces of patterns formed on the semiconductor substrate W and making the surfaces of the patterns water repellent. For example, the water-repellent agent is a silane coupling agent. The silane coupling agent contains hydrolytic groups having an affinity and a reactivity to inorganic materials and organic functional groups chemically bonding organic materials in molecules. Examples of the silane coupling agent include hexamethyldisilazane (HMDS), tetramethylsilyldimethylamine (TMSDMA), and trimethylsilyldimethylamine (TMSDEA).

The DIW supplied from the DIW supply unit 230 passes through a supply pipe 232 and is discharged from a nozzle 231. The DIW is used to rinse away a chemical liquid on the semiconductor substrate W.

The spray unit 400 sprays the water-capture agent 2 into the chamber 300 so as to capture water contained in an atmosphere in the chamber 300. Although not limited to a specific one, the water-capture agent 2 suffices to be a chemical agent that easily reacts to the water and that does not react to the chamber 300, the semiconductor substrate W, and the water-repellent agent. For example, the silane coupling agent serving as the water-repellent agent can be used as the water-capture agent 2. Examples of the silane coupling agent include HMDS, TMSDMA, and TMSDEA mentioned above.

A material same as that of the water-repellent agent can be used as that of the water-capture agent 2. However, when any one of HMDS, TMSDMA, and TMSDEA is used as the water-repellent agent, any of HMDS, TMSDMA, and TMSDEA can be used as the water-capture agent 2. In this case, a different material from that of the water-repellent agent can be used as the material of the water-capture agent 2.

The spray unit 400 evaporates the water-repellent agent 2 and sprays the evaporated water-repellent agent 2 into the chamber 300. The water-repellent agent 2 thereby reacts to the water in the atmosphere in the chamber 300 and captures the water. In other words, the water-capture agent 2 absorbs the water in the chamber 300.

The spray unit 400 sprays the evaporated water-capture agent 2 into the atmosphere in the chamber 300 either simultaneously with or before a timing at which the second chemical-liquid supply unit 220 supplies the water-repellent agent to the surface of the semiconductor substrate W. The spray unit 400 can continue spraying the water-repellent agent 2 into the chamber 300 in parallel to the supply of the water-repellent agent while the second chemical-liquid supply unit 220 is supplying the water-repellent agent. The water-capture agent 2 can thereby sufficiently capture the water in the chamber 300 before the water-repellent agent is supplied to the semiconductor substrate W. Therefore, it is possible to suppress the water-repellent agent from reacting to the water in the atmosphere in the chamber 300 and being deactivated. The spray unit 400 can spray the water-capture agent 2 continuously, instantaneously or intermittently.

The surface treatment apparatus 10 can include a vacuum device (not shown) that evacuates the air from the interior of the chamber 300. In this case, the vacuum device discharges the water in the chamber 300 to outside to some extent and the spray unit 400 sprays the water-repellent agent into the chamber 300 in a vacuum. It is thereby possible to remove the water in the chamber 300 more efficiently.

Furthermore, the surface treatment apparatus 10 can include an excimer UV (ultraviolet) irradiation unit (not shown). The excimer UV irradiation unit can selectively remove the water-repellent protection film by irradiating UV light on the semiconductor substrate W.

Figure 2:
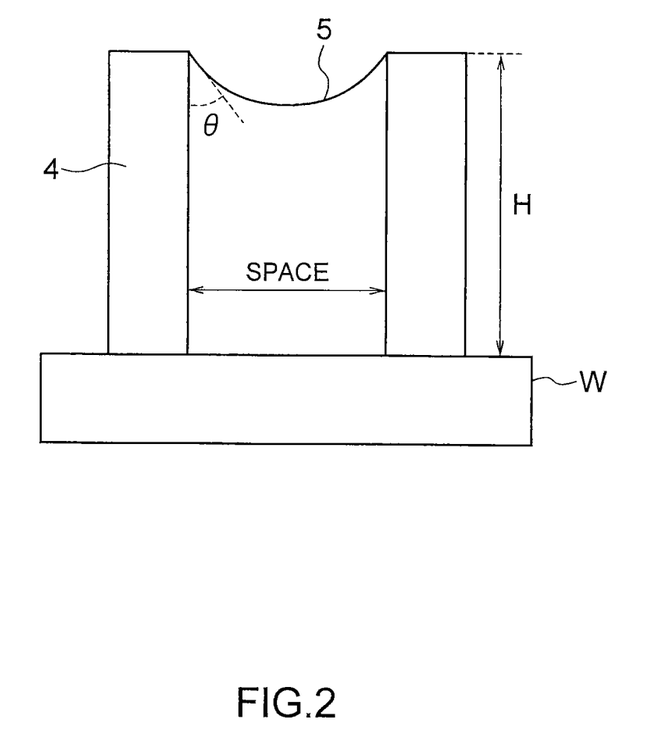
FIG. 2 shows a contact angle θ of a liquid on patterns 4 on the semiconductor substrate W.

FIG. 2 shows a contact angle $\theta$ of a liquid on patterns 4 on the semiconductor substrate W. When an aspect ratio of the patterns 4 becomes higher by downscaling the patterns 4, a liquid 5 enters between adjacent patterns 4 by the capillary of the liquid 5. In this case, power P with which the liquid 5 acts on the patterns 4 is represented by the following Equation (1).

$$P = 2 \times \gamma \times \cos \theta \cdot H \text{ SPACE} \tag{1}$$

In this equation, SPACE denotes a space between adjacent patterns 4. H denotes the height of each pattern 4. $\gamma$ denotes the surface tension of the liquid 5.

It is understood that as the contact angle $\theta$ is closer to 90°, then $\cos \theta$ becomes closer to zero and the power P acting on the patterns 4 becomes lower. The fact that the contact angle $\theta$ is closer to 90° means that the surface of the semiconductor substrate W (the surface of each pattern 4) is made water repellent. Therefore, pattern collapsing can be suppressed by making the surface of the semiconductor substrate W water repellent.

To make the surface of the semiconductor substrate W water repellent, the water-repellent protection film is formed on the surface of the semiconductor substrate W using the water-repellent agent such as the silane coupling agent (a sililation treatment). However, when the water is present in the chamber 300, the silane coupling agent has a hydrolytic reaction to the water in the chamber 300 and loses a water-repellent function. That is, the silane coupling agent is deactivated. For example, when the silane coupling agent is supplied to the rotation center of the semiconductor substrate W shown in FIG. 1, it is likely that the silane coupling agent reacts to the water and is deactivated before the silane coupling agent spreads through peripheral edges of the semiconductor substrate W. In this case, the water-repellent protection film is formed on the patterns 4 near a central portion of the semiconductor substrate W but not on the patterns 4 near the peripheral edges of the semiconductor substrate W.

On the other hand, according to the first embodiment, the spray unit 400 sprays the evaporated water-capture agent 2 into the chamber 300 at or before a time of supplying the water-repellent agent. Because the water-capture agent 2 reacts to the water in the chamber 300, a water amount in the chamber 300 greatly decreases at the time of supplying the water-repellent agent. This can suppress deactivation of the water-repellent agent. As a result, it is possible to ensure making the surface of the semiconductor substrate W and the surfaces of the patterns 4 water repellent, to make the contact angle θ closer to 90°, and to suppress collapsing of the patterns 4 on the semiconductor substrate W.

Figure 3A:
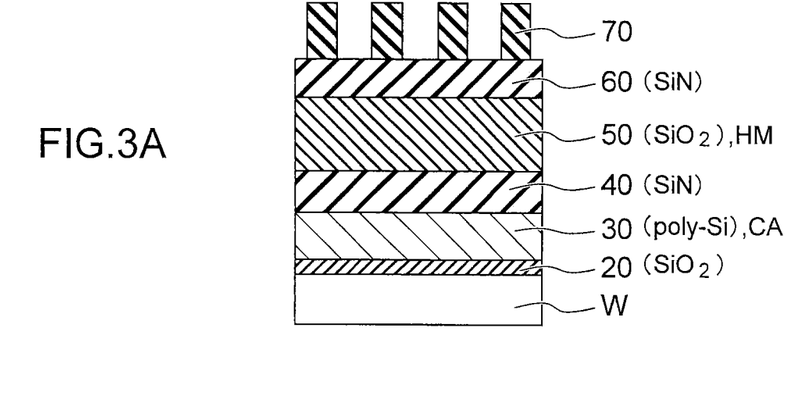
FIGS. 3A to 3D are cross-sectional views showing a manufacturing method of a NAND flash memory according to the first embodiment.
Figure 3B:
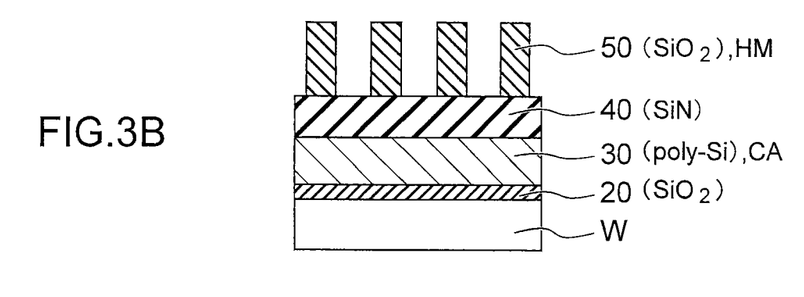
Figure 3C:
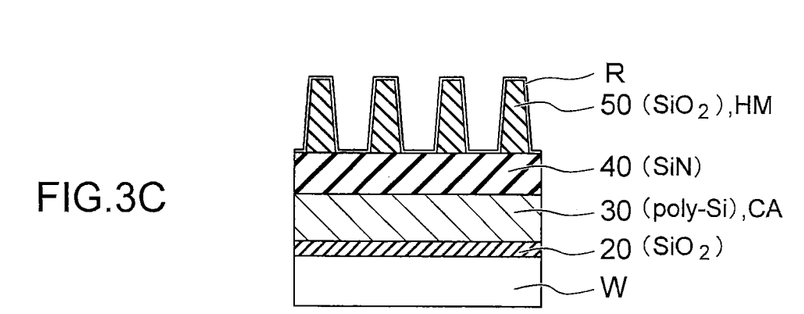
Figure 3D:
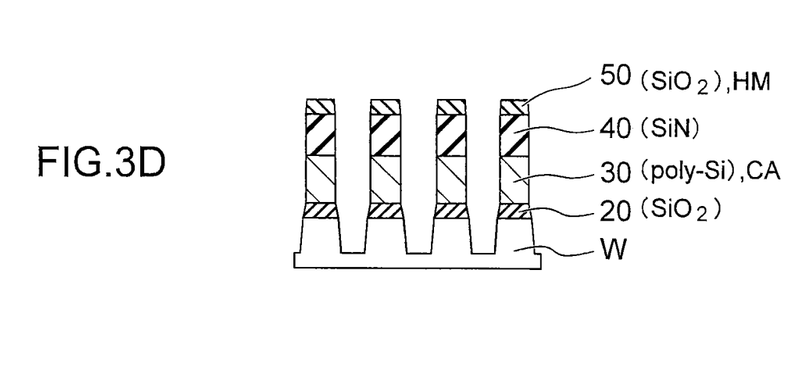
Figure 4:
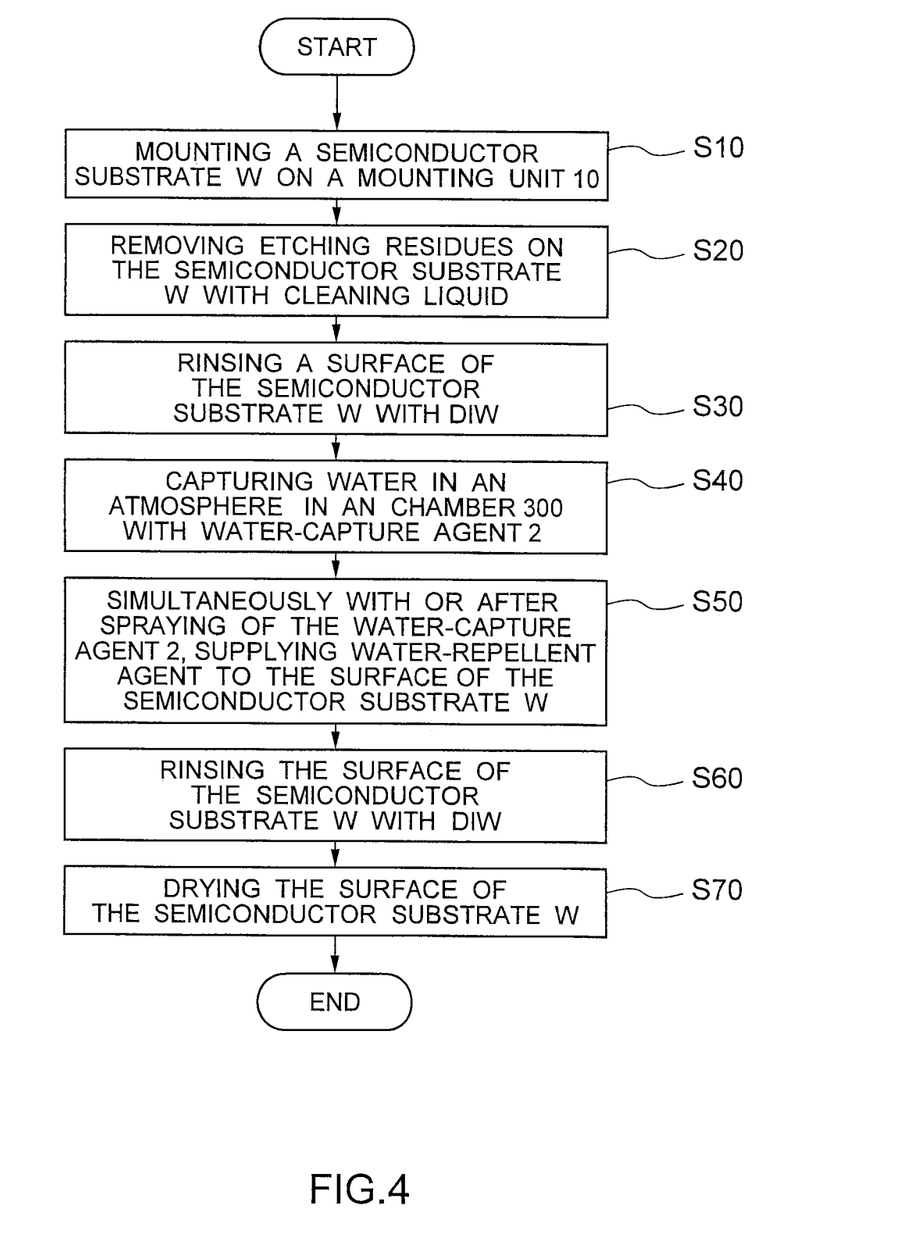
FIG. 4 is a flowchart showing the surface treatment method according to the first embodiment.

FIGS. 3A to 3D are cross-sectional views showing a manufacturing method of a NAND flash memory according to the first embodiment. FIG. 4 is a flowchart showing a surface treatment method according to the first embodiment.

The surface treatment method according to the first embodiment is applied to, for example, processes of cleaning and drying the semiconductor substrate W in processing of charge accumulation layers CA (floating gates, for example) of the NAND flash memory. Although a sidewall transfer process is often used to process the charge accumulation layers CA, an ordinary resist transfer process is used here for the brevity of descriptions. Needless to mention, the first embodiment is also applicable to cleaning and drying processes in the sidewall transfer process.

First, a gate dielectric film 20 is formed on the semiconductor substrate W. The gate dielectric film 20 is formed by thermally oxidizing the semiconductor substrate W. The thickness of the gate dielectric film 20 is about 5 nm, for example.

Next, a polysilicon layer 30 is formed on the gate dielectric film 20. The polysilicon layer 30 is used as the material of the charge accumulation layers CA. The thickness of the polysilicon layer 30 is about 100 nm, for example.

Next, a silicon nitride film 40 is formed on the polysilicon layer 30. The silicon nitride film 40 functions as an etching stopper. The thickness of the silicon nitride film 40 is about 100 nm, for example.

Next, a silicon oxide film 50 is formed on the silicon nitride film 40. The silicon oxide film 50 is used as hard masks HM for processing the polysilicon layer 30 (the charge accumulation layers CA) or the like. The thickness of the silicon oxide film 50 is 250 nm, for example.

Next, a sacrificial film 60 is formed on the silicon oxide film 50. It suffices that the sacrificial film 60 is made of a material that can selectively etch the silicon oxide film 50. For example, a silicon nitride film, a polysilicon film or the like can be used as the sacrificial film 60. The thickness of the sacrificial film 60 is 100 nm, for example.

Next, using a lithographic technique, a resist layer 70 is formed on the sacrificial film 60. The resist layer 70 is patterned to process the sacrificial film 60 into patterns of the charge accumulation layers CA. For example, the resist layer 70 is formed into line-and-space patterns. The line width and space width of the resist layer 70 are both about 20 nm, for example. The structure shown in FIG. 3A is obtained in this manner.

Next, using the resist layer 70 as a mask, the sacrificial film 60 is processed by a RIE (Reactive Ion Etching) method.

After removing the resist layer 70 using, for example, a SPM liquid (Sulfuric acid-Hydrogen Peroxide Mixture), the silicon oxide film 50 is processed by the RIE method with the sacrificial film 60 used as a mask. Etching of the silicon oxide film 50 stops on the silicon nitride film 40. The structure of the hard masks HM is thereby obtained as shown in FIG. 3B. At this time, an aspect ratio of each hard mask HM is about 10. The sacrificial film 60 can be removed at the time of etching the silicon oxide film 50.

When the sidewall transfer process is used, the sacrificial film 60 is used as a core of sidewall masks (not shown). For example, after narrowing the width of the sacrificial film 60 by slimming, a sidewall film (not shown) is deposited on the sacrificial film 60. Thereafter, the sidewall film is etched back, thereby leaving the sidewall film on both side surfaces of the sacrificial film 60 as the sidewall masks. The sidewall masks are formed by removing the sacrificial film 60. When the silicon oxide film 50 is etched using the sidewall masks as a mask, it is possible to form the hard masks HM each having a smaller line width and a smaller space width than those of a minimum feature size F (Feature size) that can be formed by the lithographic technique. In this way, the hard masks HM can be alternatively processed using the sidewall transfer process. Needless to mention, the hard masks HM can be processed into smaller patterns by repeating the sidewall transfer process.

Next, the semiconductor substrate W is cleaned so as to remove etching residues generated in the etching of the silicon oxide film 50. For example, the semiconductor substrate W is subjected to a cleaning treatment using the SPM liquid or the SC1 liquid.

After the cleaning treatment, the chemical liquid is rinsed away with the DIW. At this time, the DIW enters between the adjacent hard masks HM. When the surface of the semiconductor substrate W is dried in a state where the DIW is present between the hard masks HM, the capillary or surface tension (the power P represented by the Equation (1) mentioned above) of the DIW possibly causes collapsing of the hard masks HM.

To prevent this possibility, the surface treatment apparatus 10 according to the first embodiment forms a water-repellent protection film R on the surface of the semiconductor substrate W and those of the patterns after the cleaning treatment. A method of forming the water-repellent protection film R is described below with reference to FIG. 4.

FIG. 4 is a flowchart showing the surface treatment method according to the first embodiment. As shown in FIG. 4, after mounting the semiconductor substrate W on the mounting unit 100 (S10), the mounting unit 100 rotates the semiconductor substrate W. The first chemical-liquid supply unit 210 supplies the cleaning liquid for cleaning the semiconductor substrate W to the surface of the semiconductor substrate W arranged in the chamber 300. The cleaning liquid spreads throughout the surface of the semiconductor substrate W by rotation of the semiconductor substrate W. The etching residues are thereby removed (S20: cleaning treatment). After cleaning the semiconductor substrate W, the DIW supply unit 230 supplies the DIW to the semiconductor substrate W. The DIW spreads throughout the surface of the semiconductor substrate W by the rotation of the semiconductor substrate W. The cleaning liquid on the surface of the semiconductor substrate W is thereby rinsed away with the DIW (S30: DIW rinse treatment).

Next, the spray unit 400 evaporates the water-capture agent 2 and sprays the evaporated water-capture agent 2 into the chamber 300. The water-capture agent 2 thereby captures the water in the atmosphere in the chamber 300 (S40: water capture treatment). For example, HMDS serving as the silane coupling agent can be used as the water-capture agent 2. In this case, HMDS reacts to the water and changes to silanol. Furthermore, the bimolecular silanol is condensed into inactive siloxane. In this way, because the water-capture agent 2 reacts to the water and changes to the inactive substance, the water in the chamber 300 can be reduced.

Simultaneously with or after spraying of the water-capture agent 2, the second chemical-liquid supply unit 220 supplies the water-repellent agent to the surface of the semiconductor substrate W (S50: sililation treatment). The water-repellent agent spreads throughout the surface of the semiconductor substrate W by the rotation of the semiconductor substrate W. For example, the water-repellent agent is TMSDMA serving as the silane coupling agent. At this time, the water-repellent agent can spread throughout the surface of the semiconductor substrate W without being deactivated because the water is hardly present in the chamber 300. The water-repellent protection film R is thereby formed on the entire surfaces of the patterns on the semiconductor substrate W.

When the patterns on the semiconductor substrate W are formed of a silicon-based film such as the silicon nitride film or the polysilicon film, sufficient water repellency is not often ensured because of an insufficient sililation reaction even after the sililation treatment using the silane coupling agent. In this case, before Step S50, the surfaces of the silicon-based patterns are changed to silicon oxide-based chemical oxide films using another chemical liquid. When the sililation treatment is subsequently performed, it is possible to improve water repellency after the sililation treatment.

Many residues are generated after the etching by the RIE method. It is difficult to form the water-repellent protection film in a state where many residues remain. Therefore, it is effective to remove the residues by the cleaning treatment so as to form the water-repellent protection film. In addition, plasma damages are accumulated on the surfaces of the patterns by the RIE method and dangling bonds are generated. When a reforming treatment is performed using a cleaning liquid having an oxidation effect, the dangling bonds terminate at OH groups. If many OH groups are present, the sililation reaction probability increases, which facilitates forming the water-repellent protection film. This can further improve the water repellency. Even when the patterns are formed of the silicon oxide film, identical effects can be obtained. When the cleaning liquid has also a reforming effect (an oxidation effect), it is possible to simultaneously perform the cleaning treatment and the reforming treatment using the single cleaning liquid.

Next, the DIW supply unit 230 supplies the DIW on the semiconductor substrate W and rinses again the surface of the semiconductor substrate W (S60: DIW rinse treatment). The DIW spreads throughout the surface of the semiconductor substrate W by the rotation of the semiconductor substrate W. The mounting unit 100 accelerates a rotational speed for rotating the semiconductor substrate W to a predetermined speed, thereby draining off and drying the DIW on the surface of the semiconductor substrate W (S70: spin drying treatment). At this time, the DIW can be easily removed from the semiconductor substrate W because surfaces of the hard masks HM are already in a water repellent state. Furthermore, even if the DIW is present between the adjacent hard masks HM, the capillary or surface tension of the DIW is very low because the surfaces of the hard masks HM are already in the water repellent state. Therefore, it is difficult for the hard masks HM to collapse.

Next, using the hard masks HM as a mask, the polysilicon layer 30, the gate dielectric film 20, and the semiconductor substrate W are processed by the RIE method. The structure shown in FIG. 3D is thereby obtained.

Thereafter, STI (Shallow Trench Isolation), IPD (Inter Poly Dielectric), control gates, and the like are formed using well-known processes, thereby completing the NAND flash memory.

As described above, according to the first embodiment, the water-capture agent 2 is sprayed into the atmosphere in the chamber 300 either simultaneously with or before the timing of supplying the water-repellent agent to the surface of the semiconductor substrate W. The water-capture agent 2 thereby captures the water in the chamber 300 before the water-repellent agent is supplied to the semiconductor substrate W. Therefore, it is possible to suppress the water-repellent agent from reacting to the water in the atmosphere in the chamber 300 and being deactivated. As a result, according to the first embodiment, it is possible to ensure making the surface of the semiconductor substrate W water repellent and to suppress collapsing of the patterns on the semiconductor substrate W.

Second Embodiment

The surface treatment apparatus 10 and a surface treatment method according to a second embodiment differ from those according to the first embodiment in the use of an organic solvent in place of the water-repellent agent. Therefore, the second chemical-liquid supply unit 220 shown in FIG. 1 supplies not the water-repellent agent but the organic solvent to the semiconductor substrate W. In this case, it is unnecessary to perform the DIW rinse treatment in Step S60 shown in FIG. 4. Other configurations and processes of the second embodiment can be identical to those of the first embodiment. Because configurations of the surface treatment apparatus according to the second embodiment are basically identical to those of the surface treatment apparatus 10 according to the first embodiment shown in FIG. 1, detailed explanations thereof will be omitted.

In the second embodiment, the organic solvent is IPA, for example. The water-repellent agent can be used as the water-capture agent 2 similarly to the water-capture agent 2 in the first embodiment. The organic solvent is used in place of the water-repellent agent. This is because most of organic solvents have properties of low surface tension and high volatility. Because of the low surface tension, it is possible to suppress collapsing of the patterns on the semiconductor substrate W as described above. Because of the high volatility, the drying treatment can be performed swiftly and easily. Therefore, the liquid supplied from the second chemical-liquid supply unit 220 suffices to be a liquid low in surface tension without being specifically limited to the organic solvent. The liquid having the high volatility as well as the low surface tension is preferable because the high volatility is advantageous in the drying treatment.

The spray unit 400 sprays the water-capture agent 2 into the atmosphere in the chamber 300 either simultaneously with or before a timing at which the second chemical-liquid supply unit 220 supplies the organic solvent to the surface of the semiconductor substrate W. The spray unit 400 can continue spraying the water-repellent agent 2 into the chamber 300 in parallel to the supply of the organic solvent while the second chemical-liquid supply unit 220 is supplying the organic solvent. The water-capture agent 2 can thereby capture the water in the chamber 300 before the organic solvent is supplied to the semiconductor substrate W. Therefore, the organic solvent is suppressed from absorbing the water in the atmosphere in the chamber 300 and the organic solvent displaces the water present on the surfaces of the patterns on the semiconductor substrate W. The spray unit 400 can spray the water-capture agent 2 continuously, instantaneously or intermittently.

Figure 5:
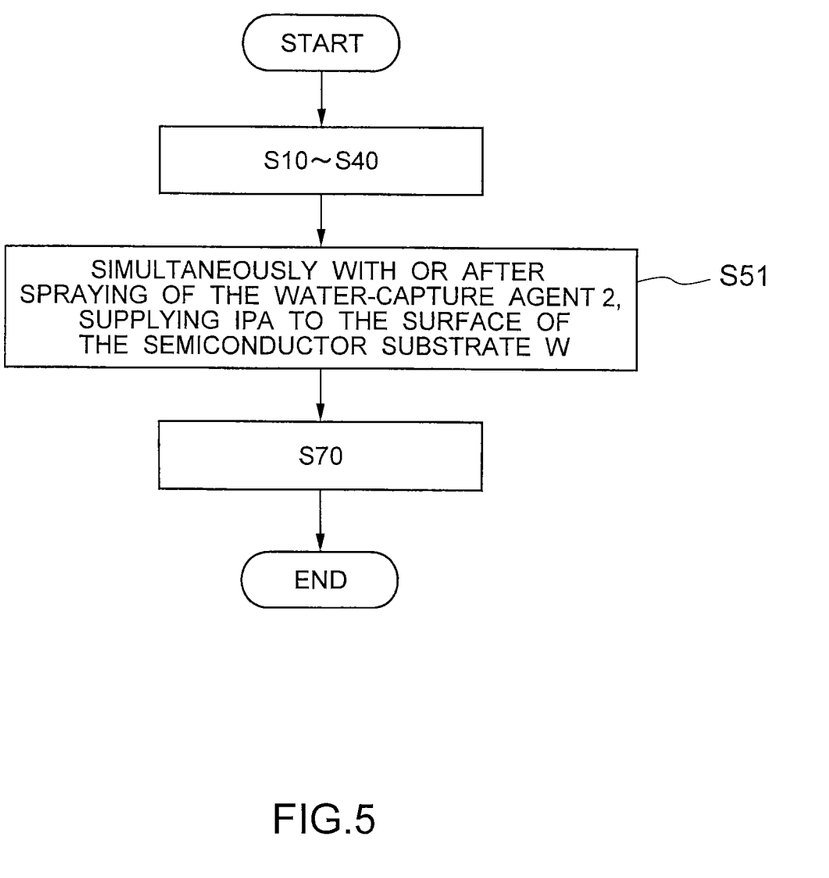
FIG. 5 is a flowchart showing the surface treatment method according to the second embodiment.

FIG. 5 is a flowchart showing the surface treatment method according to the second embodiment. Because Steps S10 to S40 in FIG. 5 are identical to Steps S10 to S40 in FIG. 4, detailed explanations thereof will be omitted.

Simultaneously with or after spraying of the water-capture agent 2, the second chemical-liquid supply unit 220 supplies the organic solvent (IPA, for example) to the surface of the semiconductor substrate W (S51). At this time, the organic solvent spreads throughout the surface of the semiconductor substrate W without absorbing the water because the water is hardly present in the chamber 300. The organic solvent thereby displaces the water present on the surfaces of the patterns on the semiconductor substrate W. Therefore, it is possible to suppress watermarks from being formed on the surface of the semiconductor substrate W at the time of an IPA drying treatment.

Thereafter, the semiconductor substrate W is dried by the spin drying treatment. Step S70 shown in FIG. 5 is the same as Step S70 shown in FIG. 4.

Generally, when the IPA that is the organic solvent is used in the cleaning process, the IPA displaces the DIW on the semiconductor substrate W and dries the surface of the semiconductor substrate W (the IPA drying treatment). However, if much water is contained in the atmosphere in the chamber 300, there is a probability that the IPA absorbs the water at the time of the IPD drying treatment and that watermarks are formed on the surface of the semiconductor substrate W when the surface is dried.

According to the second embodiment, the water-capture agent 2 is sprayed into the atmosphere in the chamber 300 either simultaneously with or before the timing of supplying the organic solvent to the surface of the semiconductor substrate W. The water-capture agent 2 can thereby capture the water in the chamber 300 before the organic solvent is supplied to the semiconductor substrate W. Therefore, the organic solvent can displace the water on the surface of the semiconductor substrate W and those of the patterns without absorbing the water in the chamber 300. If the IPA displaces the water on the surface of the semiconductor substrate W and those of the patterns, then wettability of the liquid 5 on the surface of the semiconductor substrate W improves and $\cos \theta$ in the Equation (1) becomes larger, but $\gamma$ in the Equation (1) becomes smaller. The power P thereby becomes lower as a whole. As a result, it is possible to suppress collapsing of the patterns on the semiconductor substrate W and to suppress the watermarks from being formed on the semiconductor substrate W.

The first and second embodiments are not limited to the patterns of the hard masks HM described above but applicable to arbitrary patterns having a high aspect ratio. Furthermore, the first and second embodiments are not limited to the patterns of the hard masks HM in the process of cleaning the semiconductor substrate W but applicable to resist patterns after development in a lithographic process.

Furthermore, while the spray unit 400 shown in FIG. 1 can be arranged in an upper portion of the chamber 300 in the first embodiment, the spray unit 400 can be formed integrally with the second chemical-liquid supply unit 220. When the material of the water-capture agent 2 is the same as that of the water-repellent agent, a common pipe to the spray unit 400 and the second chemical-liquid supply unit 220 can be used by forming the spray unit 400 and the second chemical-liquid supply unit 220 integrally. This makes it relatively easier to pull out the pipe.

The first and second embodiments can be combined. In this case, the surface treatment apparatus 10 includes both a water-repellent-agent supply unit that supplies the water-repellent agent and an IPA supply unit that supplies the IPA. For example, after cleaning the semiconductor substrate W, the surface treatment apparatus 10 rinses the cleaning liquid with the DIW and supplies the IPA to the semiconductor substrate W by the method according to the second embodiment. The IPA thereby displaces the water on the semiconductor substrate W. The surface treatment apparatus 10 supplies the water-repellent agent to the semiconductor substrate W by the method according to the first embodiment. The water-repellent protection film is thereby formed on the surface of the semiconductor substrate W (the surface of each pattern). The surface treatment apparatus 10 supplies the IPA again to the semiconductor substrate W by the method according to the second embodiment. The IPA thereby displaces the water-repellent agent. Furthermore, the water treatment apparatus 10 supplies the DIW again to the semiconductor substrate W. The DIW thereby displaces the IPA. Thereafter, the water treatment apparatus 10 dries the semiconductor substrate W by spinning the semiconductor substrate W. At this time, the semiconductor substrate W can be dried without collapsing of the patterns on the semiconductor substrate W because the surfaces of the patterns on the semiconductor substrate W are in a water repellent state.

Third Embodiment

Figure 6A:
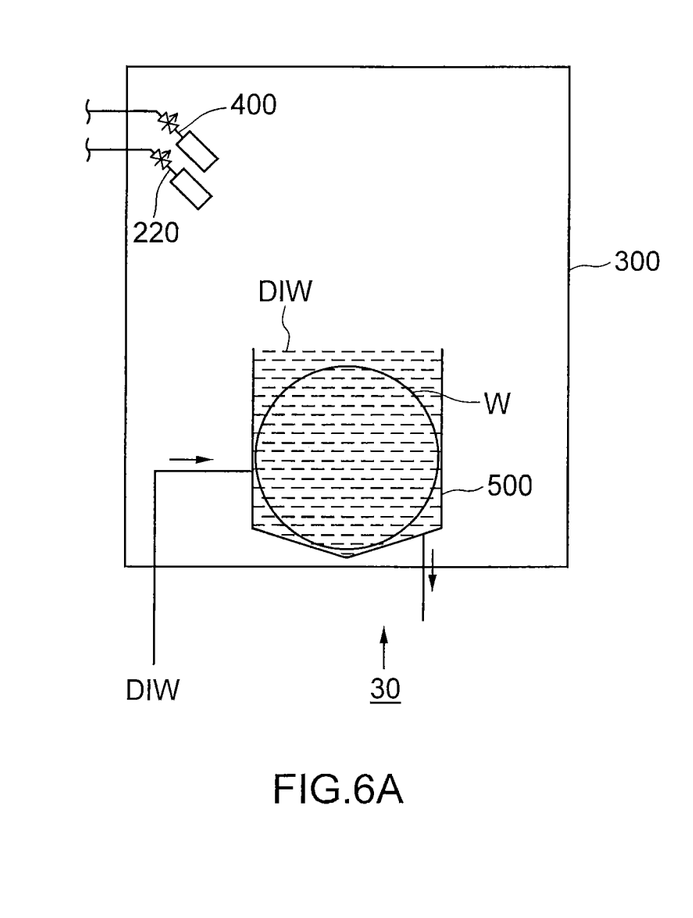
FIGS. 6A and 6B show an example of a configuration of a surface treatment apparatus 30 for semiconductor substrates according to a third embodiment.
Figure 6B:
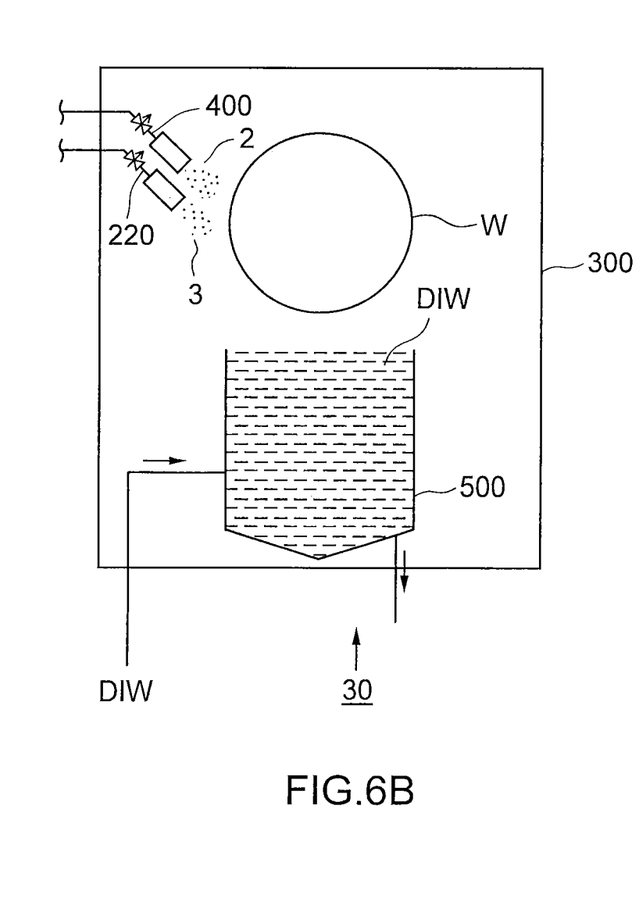

FIGS. 6A and 6B show an example of a configuration of a surface treatment apparatus 30 for semiconductor substrates according to a third embodiment. In the first and second embodiments, the surface treatment apparatus 10 is a single-wafer surface treatment apparatus for processing semiconductor substrates W one by one. On the other hand, the surface treatment apparatus 30 according to the third embodiment is a batch surface treatment apparatus for batch-processing a plurality of semiconductor substrates W. Therefore, the chamber 300 accommodates a plurality of semiconductor substrates W (semiconductor substrates W corresponding to two lots, for example) at a time. The interior of the chamber 300 can be kept in a vacuum when processing the semiconductor substrates W.

The chemical-liquid supply unit 220 sprays an evaporated organic solvent (IPA, for example) 3 into the chamber 300 so as to supply the organic solvent 3 to the semiconductor substrates W. The organic solvent 3, which is evaporated, can spread through surfaces of the semiconductor substrates W. The spray unit 400 sprays the evaporated water-capture agent 2 into the chamber 300. The water-capture agent 2, which is evaporated similarly, can spread through the surfaces of the semiconductor substrates W. Forms of the chemical-liquid supply unit 220 and the spray unit 400 are not limited to specific ones, so that either nozzle-like units shown in FIGS. 6A and 6B or the box-like units shown in FIG. 1 can be used as the chemical-liquid supply unit 220 and the spray unit 400.

For example, the IPA can be used as the organic solvent 3 similarly to the organic solvent in the second embodiment. Any of the water-repellent agents can be used as the water-capture agent 2 similarly to the water-capture agent 2 in the first embodiment.

A DIW reservoir 500 is a reservoir that stores therein the DIW and in which a batch of semiconductor substrates W can be immersed in the DIW. The DIW in the DIW reservoir 500 is circulated, filtered so as to keep a lightly doped state after use, and reused.

Figure 7:
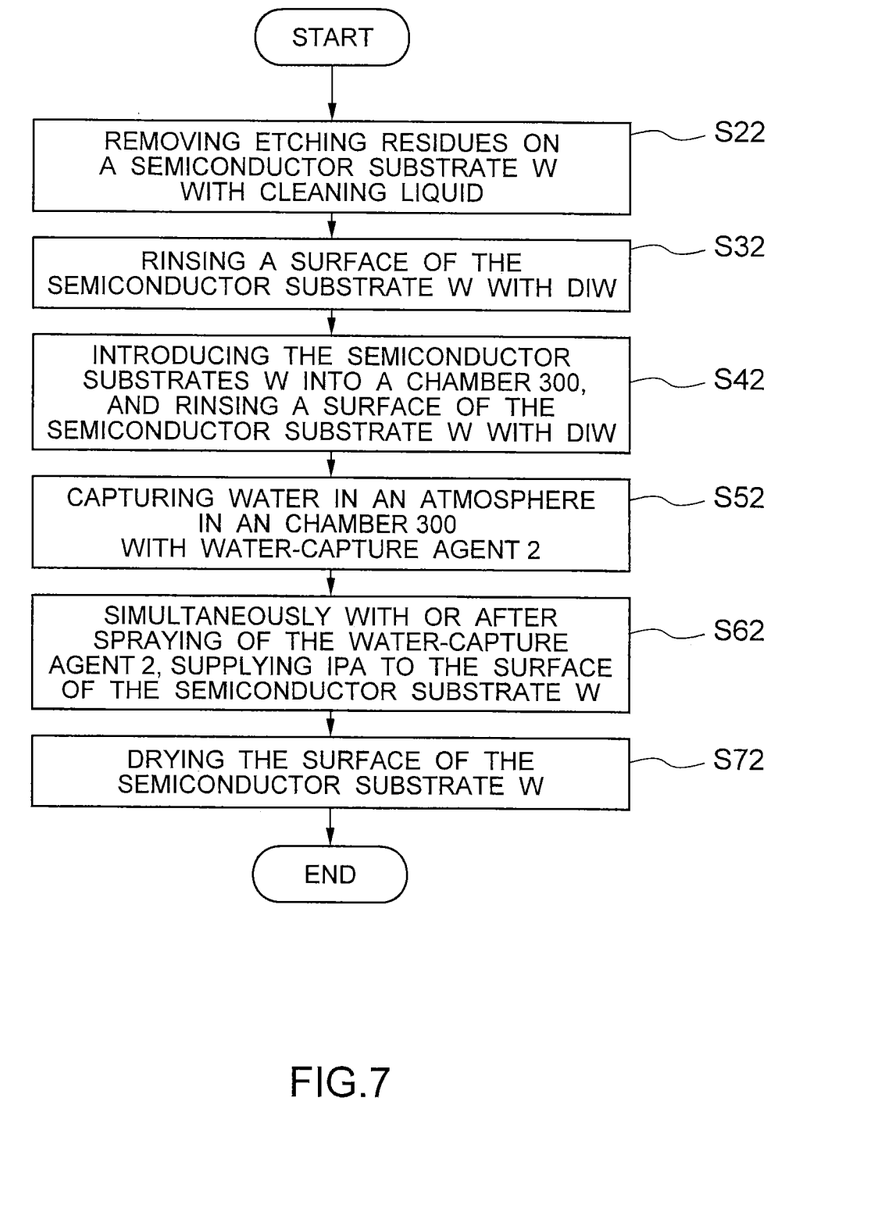
FIG. 7 is a flowchart showing a surface treatment method according to the third embodiment.

FIG. 7 is a flowchart showing a surface treatment method according to the third embodiment. The surface treatment method according to the third embodiment is described with reference to FIGS. 6A, 6B, and 7.

First, the semiconductor substrates W are subjected to the cleaning treatment using the cleaning liquid (S22). The cleaning treatment can be performed either outside or inside of the chamber 300. In the third embodiment, it is assumed that the semiconductor substrates W are cleaned outside of the chamber 300 and that the semiconductor substrates W are arranged in the chamber 300 after the cleaning liquid is rinsed away with the DIW.

The cleaning treatment can be performed either on every semiconductor substrate W or collectively on a plurality of semiconductor substrates W as a batch process. When the cleaning treatment is performed as the batch process, it suffices to store the cleaning liquid in a reservoir (not shown) similar to the DIW reservoir 500 and to immerse the semiconductor substrates W in the reservoir. A case of performing the cleaning treatment inside of the chamber 300 is described later in a modification of the third embodiment.

As described above, after the cleaning treatment, the cleaning liquid on the semiconductor substrates W is rinsed away with the DIW (S32). As shown in FIG. 6A, the semiconductor substrates W are introduced into the chamber 300 in a vacuum, the semiconductor substrates W are immersed in the DIW reservoir 500, and surfaces of the semiconductor substrates W are rinsed with the DIW (S42). Before or after arranging the semiconductor substrates W in the chamber 300, the spray unit 400 evaporates the water-capture agent 2 and sprays the evaporated water-capture agent 2 into the chamber 300. The water-capture agent 2 thereby captures the water in the atmosphere in the chamber 300 (S52).

Simultaneously with or after spraying of the water-capture agent 2, the chemical-liquid supply unit 220 supplies the evaporated organic solvent 3 to the surfaces of the semiconductor substrates W (S62). The organic solvent 3 can easily spread through the surfaces of the semiconductor substrates W because the organic solvent 3 is sprayed in an evaporated state. At this time, the organic solvent 3 can spread throughout the surfaces of the semiconductor substrates W without absorbing the water because the water is hardly present in the chamber 300. The organic solvent (IPA, for example) 3 can thereby easily displace the water on the entire surfaces of the semiconductor substrates W when the chemical-liquid supply unit 220 supplies the organic solvent 3.

Next, the semiconductor substrates W are pulled out of the DIW reservoir 500 and dried (S72). At this time, the organic solvent 3 displaces the water on the surfaces of the hard masks HM. Therefore, it is easy to remove the DIW from the semiconductor substrates W and it is difficult for the patterns of the hard masks HM to collapse. It is also possible to suppress watermarks from being formed on the surfaces of the semiconductor substrates W.

Other processes in the third embodiment can be performed similarly to the corresponding processes in the second embodiment. According to the third embodiment, it is thereby possible to perform the IPA drying treatment collectively on a batch of the semiconductor substrates W. The third embodiment can achieve effects identical to those of the second embodiment.

MODIFICATION OF THIRD EMBODIMENT

In the third embodiment, the cleaning treatment for cleaning the semiconductor substrates W (S22 in FIG. 7) and the DIW rinse treatment for rinsing away the cleaning liquid with the DIW (S32 in FIG. 7) are performed outside of the chamber 300. In the modification of the third embodiment, the cleaning treatment for cleaning the semiconductor substrates W and the rinse treatment for rinsing away the cleaning liquid with the DIW are performed inside of the chamber 300. In this case, it suffices to initially store the cleaning liquid in the treatment reservoir 500 and to replace the cleaning liquid in the treatment reservoir 500 with the DIW after performing the cleaning treatment. At this time, the semiconductor substrates W can be kept stored in the treatment reservoir 500. Alternatively, the semiconductor substrates W can be temporarily pulled out of the treatment reservoir 500 and, after replacing the cleaning liquid in the treatment reservoir 500 with the DIW, the semiconductor substrates W can be stored again in the treatment reservoir 500 and the cleaning liquid on the semiconductor substrates W can be rinsed with the DIW.

After rinsing the cleaning liquid with the DIW, the semiconductor substrates W are pulled out of the treatment reservoir 500, and Steps S42 to S72 shown in FIG. 7 are performed. According to this modification, the cleaning treatment and the drying treatment can be performed for every batch of the semiconductor substrates W. This modification can also achieve effects identical to those of the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device for manufacturing the semiconductor device using a semiconductor manufacturing apparatus, which comprises a chamber, the method comprising:

mounting a semiconductor substrate on a mounting unit;

rotating the semiconductor substrate;

supplying a cleaning liquid to a surface of the semiconductor substrate to remove residue from the semiconductor substrate;

supplying deionized water to the semiconductor substrate to rinse away the cleaning liquid;

spraying, from an upper portion of the chamber, a water-capture agent capturing water into an atmosphere in the chamber, the water-capture agent being sprayed into the atmosphere above the semiconductor substrate in a vaporized state such that the water-capture agent enters into the atmosphere in the chamber in the vaporized state, but not being directly sprayed on the semiconductor substrate, the water-capture agent reacting to water and changing to silanol or siloxane, the upper portion being farther away from the semiconductor substate than from other portions of the chamber where the cleaning liquid and the deionized water are sprayed from, and the other portions being between the upper portion and the semiconductor substrate; and supplying a water-repellent agent or an organic solvent to a surface of the semiconductor substrate either simultaneously with or after spraying of the water-capture agent to replace water on a surface of the semiconductor substrate with the water-repellent agent or the organic solvent, the water-repellent agent or the organic solvent forming a water-repellent protection film on the surface of the semiconductor substrate;

supplying deionized water to the semiconductor substrate to rinse away the cleaning liquid; and draining off and drying the deionized water on the surface of the semiconductor substrate, wherein the water-capture agent reacts with water in the chamber before supplying the water-repellent agent or the organic solvent and decreases the water in the chamber at a time of supplying the water-capture agent.

2. The method of claim 1, wherein the water-capture agent is a chemical liquid same as the water-repellent agent.

3. The method of claim 1, wherein the water-repellent agent is a silane coupling agent, and the organic solvent is isopropyl alcohol.

4. The method of claim 2, wherein the water-repellent agent is a silane coupling agent, and the organic solvent is isopropyl alcohol.

5. The method of claim 1, further comprising rotating the semiconductor substrate in order to drain off a liquid on the semiconductor substrate after supplying the water-repellent agent or the organic solvent.

6. The method of claim 5, wherein
the chamber accommodates a plurality of the semiconductor substrates, and
the method includes spraying the organic solvent to surfaces of the semiconductor substrates.

7. The method of claim 1, wherein supply of the organic solvent includes spraying the water-repellent agent or the organic solvent to the surface of the semiconductor substrate.

8. The method of claim 1, wherein
the chamber accommodates a plurality of the semiconductor substrates, and
the method includes spraying the organic solvent to surfaces of the semiconductor substrates.

\* \* \* \* \*